US011032960B2

(12) United States Patent
Ohashi et al.

(10) Patent No.: US 11,032,960 B2
(45) Date of Patent: Jun. 8, 2021

(54) FEEDER

(71) Applicant: FUJI CORPORATION, Chiryu (JP)

(72) Inventors: Hiroyasu Ohashi, Toyota (JP); Hiroki Murase, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 250 days.

(21) Appl. No.: 16/309,153

(22) PCT Filed: Jul. 6, 2016

(86) PCT No.: PCT/JP2016/070037
§ 371 (c)(1),
(2) Date: Dec. 12, 2018

(87) PCT Pub. No.: WO2018/008115
PCT Pub. Date: Jan. 11, 2018

(65) Prior Publication Data
US 2020/0187398 A1 Jun. 11, 2020

(51) Int. Cl.
*B23P 19/00* (2006.01)
*H05K 13/04* (2006.01)
*H05K 13/02* (2006.01)

(52) U.S. Cl.
CPC ......... *H05K 13/0419* (2018.08); *H05K 13/02* (2013.01)

(58) Field of Classification Search
CPC .................. H05K 13/0419; H05K 13/02
See application file for complete search history.

(56) References Cited

U.S. PATENT DOCUMENTS

| 6,261,047 | B1 | 7/2001 | Kubota | |
| 6,379,098 | B1* | 4/2002 | Shibasaki | H05K 13/0419 |
| | | | | 414/416.01 |
| 10,159,170 | B2* | 12/2018 | Ohashi | H05K 13/0419 |
| 10,342,168 | B2* | 7/2019 | Ohashi | H05K 13/0419 |
| 10,384,901 | B2* | 8/2019 | Chi | B65H 19/1852 |

(Continued)

FOREIGN PATENT DOCUMENTS

| JP | 11-97889 A | 4/1999 |
| JP | 2014-82454 A | 5/2014 |
| WO | WO98/37746 A1 | 8/1998 |

OTHER PUBLICATIONS

International Search Report dated Sep. 27, 2016, in PCT/JP2016/070037, filed Jul. 6, 2016.

*Primary Examiner* — Paul D Kim
(74) *Attorney, Agent, or Firm* — Oblon, McClelland, Maier & Neustadt, L.L.P.

(57) ABSTRACT

A feeder includes a feeder main body, a tape guide provided in feeder main body, a tape separating device to separate cover tape covering component storage sections, a tape conveyance path between the feeder main body and the tape guide and having recessed groove through which the component storage sections of the embossed carrier tape can be inserted, and a pressing device disposed in the recessed groove of the tape conveyance path to press the embossed carrier tape in a direction in which the embossed carrier tape is brought into abutment with the tape guide. The pressing device is positioned at both sides of the component storage sections in a width direction in of the recessed groove and presses flange sections of the embossed carrier tape without pressing the component storage sections.

4 Claims, 13 Drawing Sheets

(56) References Cited

U.S. PATENT DOCUMENTS

| | | | |
|---|---|---|---|
| 10,548,251 B2* | 1/2020 | Sugimoto | H05K 13/0419 |
| 10,765,047 B2* | 9/2020 | Sugimoto | H05K 13/0408 |
| 2008/0006922 A1* | 1/2008 | Gutentag | H01L 21/67132 |
| | | | 257/686 |
| 2015/0296669 A1* | 10/2015 | Kitani | H05K 13/0417 |
| | | | 221/71 |
| 2017/0347502 A1* | 11/2017 | Ohashi | H05K 13/0417 |
| 2018/0027709 A1* | 1/2018 | Sugimoto | H05K 13/0857 |
| | | | 29/739 |

* cited by examiner

[FIG. 13]
RELATED ART
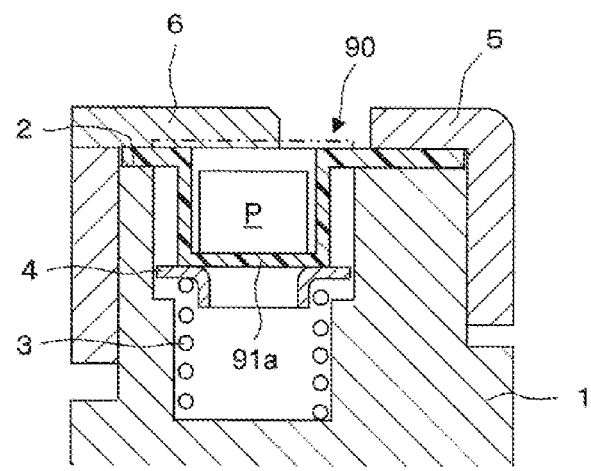

FEEDER

TECHNICAL FIELD

The present application relates to a feeder including a tape separating device configured to separate a cover tape of a carrier tape.

BACKGROUND ART

Patent Literature 1 discloses an autoloading feeder configured to convey automatically a next carrier tape when the current one is used up and to start using the next carrier tape. In this type of feeder, a cover tape is separated by the tape separating device by making use of the feeding of a carrier tape so as to open a component storage section before an electronic component is picked up from the component storage section.

In the auto-loading feeder, to enable a cover tape to be accurately separated by a separating member of the tape separating device, it is desired that a carrier tape is forced towards the separating member, whereby a cover tap is brought into abutment with the separating member, causing the separating member to enter between a base tape and the cover tape of the carrier tape in an ensured manner.

PATENT LITERATURE

Patent Literature 1: JP-A-2014-82454

BRIEF SUMMARY

Technical Problem

To make this happen, conventionally, as shown in FIG. 13, a lower surface of carrier tape 90 conveyed on tape conveyance path 2 provided in feeder main body 1 is pressed towards separating member 6 provided on tape guide 5 by means of pressing member 4 biased by spring 3, so that separating member 6 enters between a base tape and a cover tape of carrier tape 90 in an ensured fashion.

However, when carrier tape 90 is of an embossed type, component storage section (embossed section) 91a is pressed against by pressing member 4, in particular, when a biasing force of spring 3 is increased, which turns out component storage section 91a being collapsed by the force of pressing member 4, whereby electronic component P stored in component storage section 91a is pushed out of component storage section 91a. As a result, a drawback is likely to happen such that the electronic component P that has been pushed out is damaged by the separating member 6.

The present disclosure has been made to solve the problem described above, and an object of the present disclosure is to provide a feeder in which a component storage section of an embossed type carrier tape is prevented from being collapsed even when the carrier tape is pressed against with a strong biasing force.

Solution to Problem

With a view to solving the problem, according to an aspect of the present disclosure, there is provided a feeder, for conveying an embossed carrier tape, having a component storage section with protruding shape and flange sections extending outwards from both sides of the component storage section, comprising: a feeder main body; a feeding device provided on the feeder main body and configured to feed the embossed carrier tape to a component pick-up position; a tape guide provided on the feeder main body and having a tape separating device configured to separate a cover tape covering the component storage section; a tape conveyance path, being provided between the feeder main body and the tape guide with extending along a tape feeding direction of the embossed carrier tape, and having a recessed groove through which the component storage section of the embossed carrier tape can be inserted and passed, and a pressing device disposed in the recessed groove of the tape conveyance path and configured to press the embossed carrier tape in a direction in which the embossed carrier tape is brought into abutment with the tape guide, wherein the pressing device is positioned on both sides of the component storage section in a width direction in the recessed groove and configured to press the flange sections without pressing the component storage section.

According to an aspect of the present disclosure, since the pressing device, which is configured to press the embossed carrier tape in the direction in which the embossed carrier tape is brought into abutment with the tape guide, is positioned at both the sides of the component storage section in the width direction so as to press the flange sections without pressing the component storage section, the embossed carrier tape can be brought into abutment with the tape separating device accurately without collapsing the component storage section of the carrier tape, whereby the separation of the cover tape can be executed in an ensured fashion.

BRIEF DESCRIPTION OF DRAWINGS

FIG. 13 is a drawing showing a conventional example.

DESCRIPTION OF EMBODIMENT (Configuration of Electronic Component Mounter)

Figure 1:
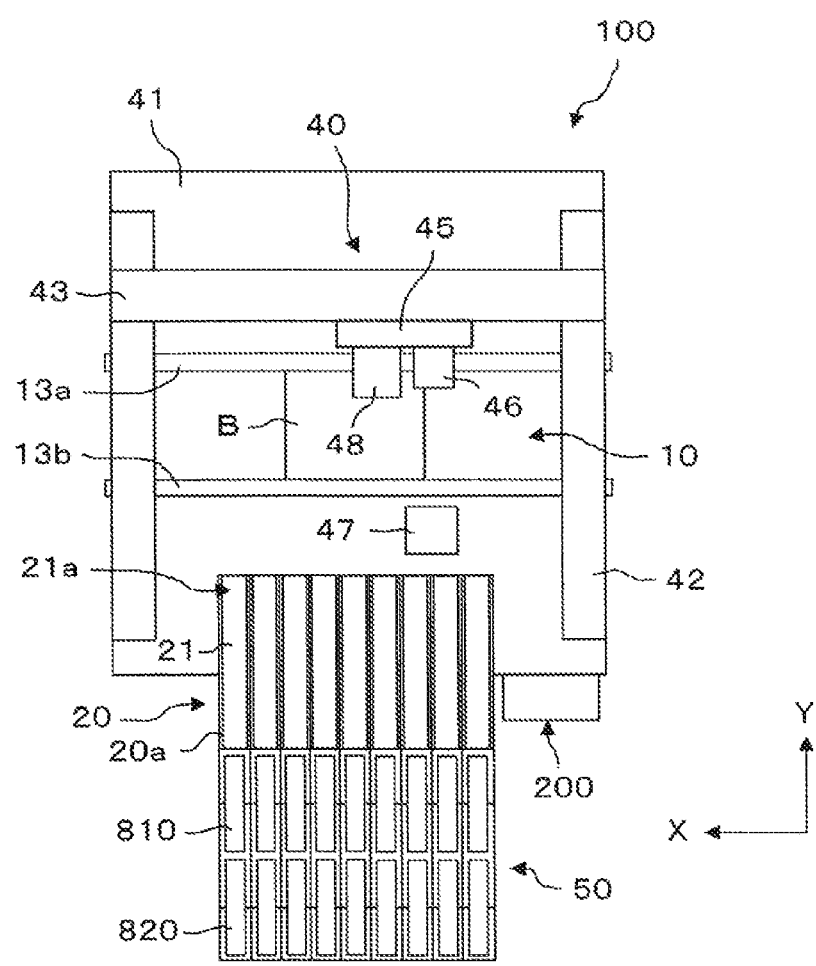
FIG. 1 is an overall plan view of an electronic component mounter preferable for carrying out the present disclosure.

Hereinafter, an embodiment of the present disclosure will be described based on drawings. FIG. 1 shows electronic component mounter 100 including feeders 21, and electronic component mounter 100 includes board conveyance section 10 configured to convey circuit board B, component supply section 20 configured to supply electronic components, component mounting section 40 configured to mount an electronic component on circuit board B, reel holding section 50, and control device 200 configured to control these constituent sections. In the following description, a conveyance direction of circuit board B will be referred to as an X-axis direction, and a horizontal direction perpendicular to the X-axis direction will be referred to as a Y-axis direction.

As shown in FIG. 1, component supply section 20 includes multiple slots 20a and multiple feeders 21 detachably mounted in corresponding slots 20a. Multiple slots 20a are provided parallel or side by side in the X-axis direction in component supply section 20. First reels 810 and second reels 820, around which a carrier tape 90 (refer to FIG. 2) is wound, are held in reel holding section 50 in an exchangeable manner. One first reel 810 and one second reel 820 are provided so as to be aligned in series in the Y direction in each feeder 21, and multiple first reels 810 and multiple second reels 820 are each provided so as to be arranged parallel or side by side in the X direction in corresponding feeders 21.

Carrier tape 90, which is wound around first reel 810 and second reel 820, can be inserted into each feeder 21. Then, carrier tape 90, which is wound around one reel 810 (820), is sequentially conveyed to component pick-up position 21a provided at a distal end portion of feeder 21 by feeder 21. As a result, an electronic component held to carrier tape 90 is positioned at component pick-up position 21a. As this occurs, carrier tape 90, which is wound around the other reel 820 (810), is not conveyed by the feeder 21 and remains standing by.

In the following description, as a matter of convenience in description, to distinguish carrier tap 90 in conveyance (in use) from carrier tape 90 remaining standing by, there may be a case where the former is referred to as first carrier tape 90A and the latter is referred to as second carrier tape 90B. In this case, since the second carrier tape becomes a first carrier tape after all electronic components stored in the first carrier tape are used up, no specific carrier tape is denoted by the first carrier tape and the second carrier tape.

Figure 2:
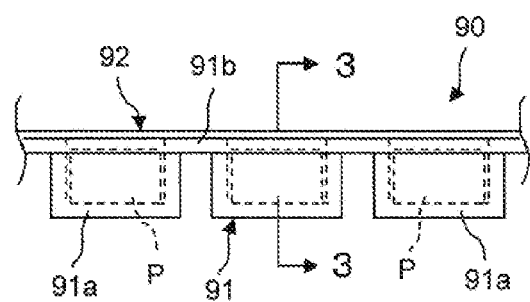
FIG. 2 is a side view of an embossed carrier tape.
Figure 3:
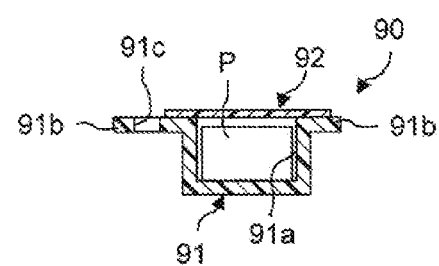
FIG. 3 is a sectional view of the embossed carrier tape taken along a line 3-3 in FIG. 2.

As shown in FIGS. 2 and 3, multiple electronic components P are stored at intervals in carrier tape 90. In this embodiment, carrier tape 90 is illustrated as being an embossed carrier tape. Embossed carrier tape 90 is made up of base tape 91 and cover tape 92.

Protruding component storage sections (embossed sections) 91a, which protrude downwards, are formed at certain intervals on base tape 91, and electronic components P are stored in component storage sections 91a. In addition, flange sections 91b are formed on both sides of base tape 91 in a width direction so as to extend outwards from both sides of component storage section 91a. Base tape 91 is formed of a soft material such as resin. Engagement holes (sprocket holes) 91c are provided at constant intervals in a longitudinal direction in flange section 91b on one side of base tape 91 so as to penetrate the flange portion.

Both end portions of cover tape 92 in the width direction are bonded to an upper surface of base tape 91 to thereby close component storage sections 91a. Electronic components P stored in component storage sections 91a are prevented from being ejected therefrom by cover tape 92. Cover tape 92 is formed of a transparent polymer film.

As shown in FIG. 1, board conveyance section 10 includes a pair of guide rails 13a and 13b provided on base 41 of component mounting section 40. In addition, component conveyance section 10 includes a conveyor belt, not shown, configured to support and convey circuit board B guided by guide rails 13a, 13b and a clamp device, not shown, configured to clamp and raise circuit board B conveyed to a predetermined position. Circuit board B on which electronic component P is mounted is conveyed in the X-axis direction to a component mounting position by the conveyor belt while being guided by the guide rails 13a, 13b of board conveyance section 10. Circuit board B conveyed to the component mounting position is positioned and clamped by the clamp device.

Component mounting section 40 has guide rails 42, Y-axis slide 43, X-axis slide 45, and component mounting head 48 holding a suction nozzle, not shown. Y-axis slide 43 and X-axis slide 45 are restricted from moving in the Y-axis direction and the X-axis direction by a Y-axis servomotor and an X-axis servomotor, both of which are not shown, respectively. A Y-axis robot is made up of guide rails 42 and Y-axis slide 43. Guide rails 42 are mounted on base 41 to face each other in the Y-axis direction and are provided above board conveyance section 10. Y-axis slide 43 is provided so as to move in the Y-axis direction along the guide rails 42. Y-axis slide 43 is moved in the Y-axis direction via a ball screw mechanism by the Y-axis servomotor, not shown.

An X-axis robot is made up of X-axis slide 45. X-axis slide 45 is provided on Y-axis slide 43 so as to move in the X-axis direction. The X-axis servomotor, not shown, is provided on Y-axis slide 43. X-axis slide 45 is moved in the X-axis direction via a ball screw mechanism by the X-axis servomotor. Component mounting head 48 is provided on X-axis slide 45. Component mounting head 48 holds multiple suction nozzles (not shown) detachably. The suction nozzles pick up through suction electronic component P conveyed to component pick-up position 21a and mount it on circuit board B which is positioned in the component mounting position by board conveyance section 10.

Board camera 46 is attached to X-axis slide 45. Board camera 46 captures an image of a reference mark provided on circuit board B positioned in the board mounting position or electronic component P conveyed to component pick-up position 21a from above to obtain board position reference information and component position information. Component camera 47 is provided on base 41, and component camera 47 can capture an image of electronic component picked up through suction by the suction nozzles from below.

Control device 200 controls feeder 21 and controls first servomotor 22 and second servomotor 23 of feeders 21, which will be described later. Control device 200 includes a microprocessor and a driver configured to supply drive current to servomotors 22, 23 When feeder 21 is mounted in corresponding slot 20a of component supply section 20, electric power is supplied from a main body side of electronic component mounter 100 to feeder 21 via a communication connector, not shown, and necessary information on a feeder ID, for example, is transmitted from feeder 21 to control device 200 of electronic component mounter 100. As a result, information on electronic component P that is fed by carrier tape 90 loaded in feeder 21 is acquired based on a serial ID of feeder 21 and stored in control device 200.

(Configuration of Feeder)

Figure 4:
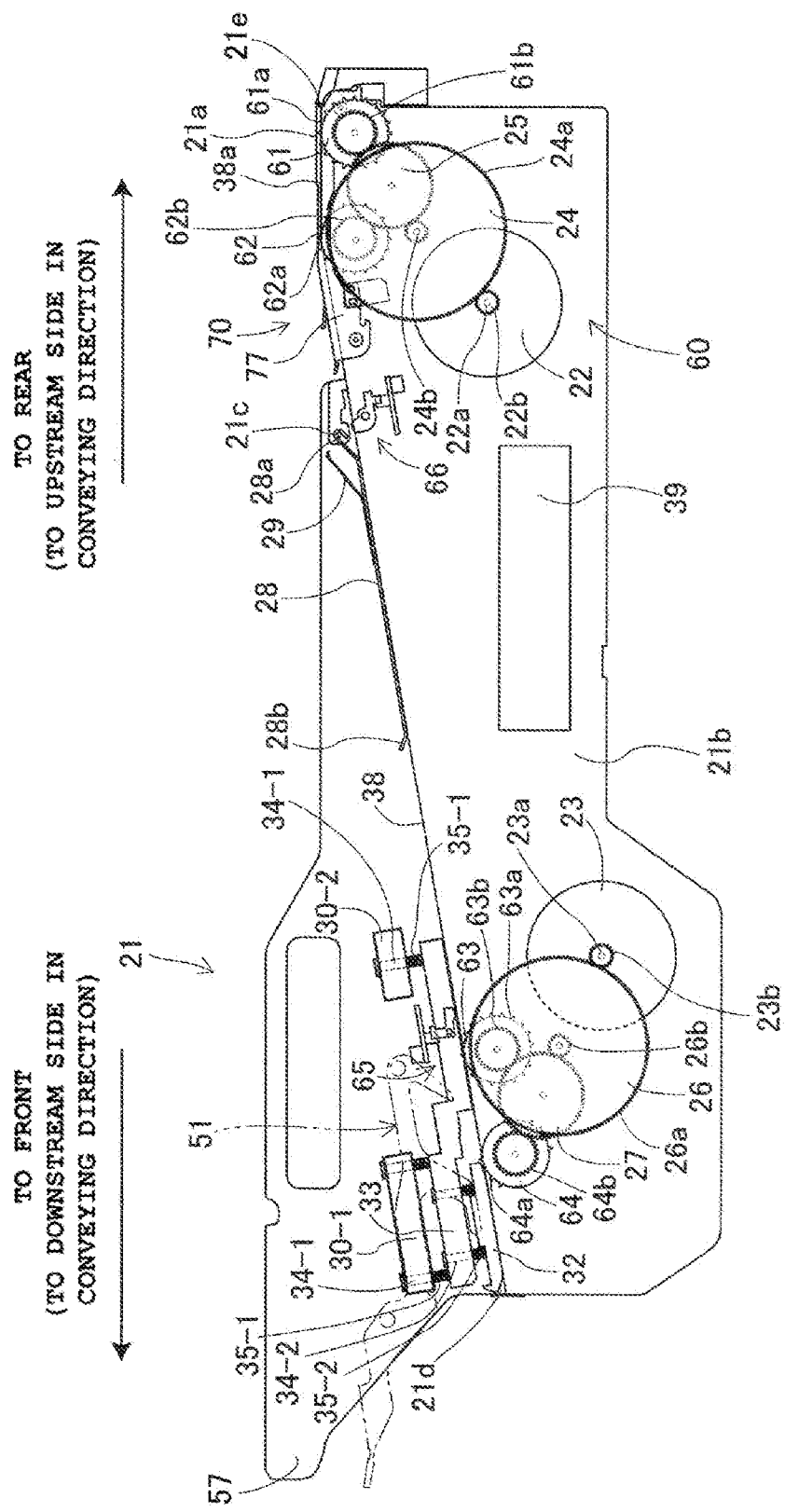
FIG. 4 is an exploded side view of a feeder illustrating an embodiment of the present disclosure.

Next, the configuration of feeder 21 will be described by use of FIGS. 4, 5. As shown in FIG. 4, feeder 21 is made up mainly of feeder main body 21b, tape conveyance path 38, first sprocket 61 and second sprocket 62, which are front sprockets, third sprocket 63 and fourth sprocket 64, which are rear sprockets, a tape separating device 70, and the like.

Figure 5:
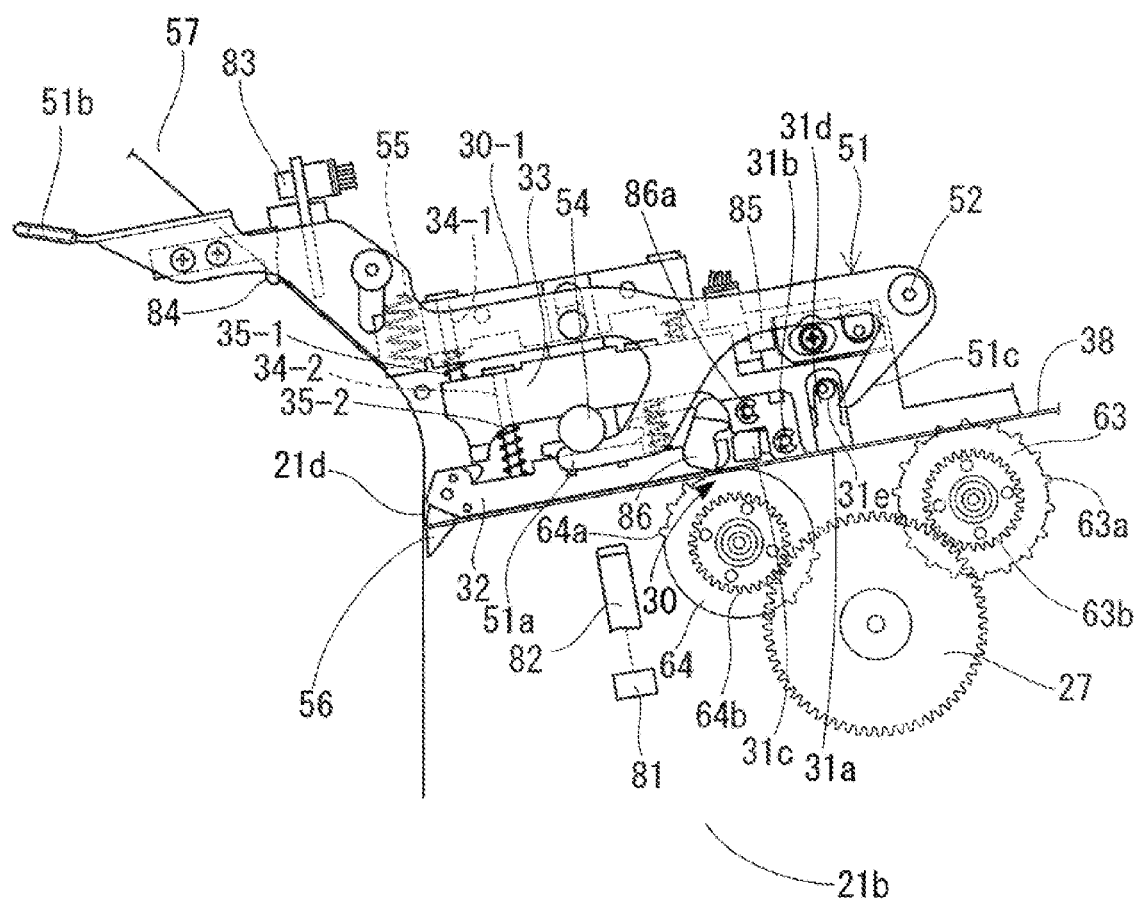
FIG. 5 is an enlarged detailed view of a periphery of a rear sprocket provided at a rear portion of the feeder.

In FIGS. 4 and 5, a side wall of feeder main body 21b is removed so that an internal structure of feeder 21 becomes visible.

As shown in FIG. 4, feeder main body 21b has a flat box shape. Tape insertion section 21d, into which carrier tape 90 is inserted, is provided at a rear portion, and tape discharge section 21e, from which carrier tape 90 is discharged, is provided at a front portion of feeder main body 21b. Tape insertion section 21d has the same width as that of tape conveyance path 38 and is provided as an entrance to tape conveyance path 38. Tape discharge section 21e has the same width as that of tape conveyance path 38 and is provided as an exit from tape conveyance path 38. Tape conveyance path 38 conveys carrier tape 90 from the rear to the front of feeder main body 21b.

Entrance pressing member 32 presses carrier tape 90, being inserted from tape insertion section 21d towards tape conveyance path 38, is disposed along an upper surface of a rear portion of tape conveyance path 38 in the vicinity of tape insertion section 21d, and is configured to move towards and away from tape conveyance path 38. Entrance pressing member 32 is attached so as to extend downwards from a rear portion of downstream side pressing member 33 via a pair of shafts 34-2 and can move vertically. Springs 35-2 configured to bias entrance pressing member 32 downwards are attached to pair of shafts 34-2.

Downstream side pressing member 33 presses carrier tape 90 downwards at a downstream side of entrance pressing member 32 and is provided so as to move towards and away from tape conveyance path 38. Downstream side pressing member 33 is attached to first support member 30-1 and second support member 30-2 which are attached to feeder main body 21b via shaft 34-1 so as to move vertically. Spring 35-1 configured to bias downstream side pressing member 33 downwards is attached to shaft 34-1.

First sprocket 61 and second sprocket 62 are provided on feeder main body 21b in a position lying below front portion 38a of tape conveyance path 38, that is, in a position adjacent to component pick-up position 21a of feeder main body 21b, and are configured to be rotatable from the front towards the rear (from a downstream side towards an upstream side of a conveyance direction). Third sprocket 63 and fourth sprocket 64 are provided on feeder main body 21b in a position lying below a rear portion of tape conveyance path 38, and are configured to be rotatable from the front towards the rear.

Engagement projections 61a, 62a, 63a are provided at constant angular intervals along a full circumference of first sprocket 61, second sprocket 62, and third sprocket 63, respectively. Engagement projections 64a are provided on part of an outer circumference of fourth sprocket 64 at intervals of 180 degrees. That is, portions where no engagement projections are formed exist between engagement projections 64a of fourth sprocket 64. Engagement projections 61a to 64a can engage in engagement holes (sprocket holes) 91b of carrier tape 90.

First sprocket gear 61b, second sprocket gear 62b, third sprocket gear 63b and fourth sprocket gear 64b are provided radially inwards of outer circumferential portions of first sprocket 61 to fourth sprocket 64, respectively. Window holes, not shown, are provided in tape conveyance path 38 in positions lying above sprockets 61 to 64, and engagement projections 61a to 64a project into tape conveyance path 38 through the corresponding widow holes.

First servomotor 22 is a motor configured to rotate first sprocket 61 and second sprocket 62. First drive gear 22b is provided on rotational shaft 22a of first servomotor 22. First gear 24 is provided rotatably on feeder main body 21b in a position below first sprocket 61 and second sprocket 62. First outer gear 24a is provided on an outer circumference of first gear 24 so as to mesh with first drive gear 22b. First inner gear 24b is provided on first gear 24 in a position lying radially inwards of the outer circumference of first gear 24.

Second gear 25 is provided rotatably on feeder main body 21b in a position lying between first sprocket 61 and second sprocket 62 and first gear 24. Second gear 25 meshes with first sprocket gear 61b, second sprocket gear 62b and first inner gear 24b. By adopting this configuration, the rotation of first servomotor 22 is decelerated and is then transmitted to first sprocket 61 and second sprocket 62, whereby first sprocket 61 and second sprocket 62 rotate in synchronism with each other.

Second servomotor 23 is a motor configured to rotate third sprocket 63 and fourth sprocket 64. Second drive gear 23b is provided on rotational shaft 23a of second servomotor 23. Third gear 26 is provided rotatably on feeder main body 21b in a position lying below third sprocket 63 and fourth sprocket 64. Third outer gear 26a is provided on an outer circumference of third gear 26 so as to mesh with second drive gear 23b. Third inner gear 26b is provided on third gear 26 in a position lying radially inwards of the outer circumference of third gear 26.

Fourth gear 27 is provided rotatably on feeder main body 21b in a position lying between third sprocket 63 and fourth sprocket 64 and third gear 26. Fourth gear 27 meshes with third sprocket gear 63b, fourth sprocket gear 64b, and third inner gear 26b. By adopting this configuration, the rotation of second servomotor 23 is decelerated and is then transmitted to third sprocket 63 and fourth 64, whereby third sprocket 63 and fourth sprocket 64 rotate in synchronism with each other.

Feed device 60 configured to feed embossed carrier tape 90 to component pick-up position 21a is made up of first servomotor 22, second servomotor 23 and first sprocket 61 to fourth sprocket 64 which are rotated by servomotors 22, 23.

As shown in FIG. 5, operation lever 51 is provided above tape insertion section 21d at the rear portion of feeder main body 21b so as to project to the rear and is supported so as to rotate about a pivot 52. Lever operation gripping section 57 (refer to FIG. 4) is provided so as to project from a rear portion of feeder main body 21d towards the rear above the operation lever 51. In operation lever 51, the first side of the operation lever, facing the pivot 52, is stored in lever operation gripping section 57 while the second side of operation lever 51, facing operation knob 51b, is provided so as to project from lever operation gripping section 57, which enables an operator to operate easily operation knob 51b with his or her fingers by gripping on lever operation gripping section 57 with his or her palm.

As will be described later, operation lever 51 is coupled operably to entrance pressing member 32. Engagement member 54 is provided between a pair of shafts 34-2 on entrance pressing member 32. Operating engagement section 51a, which is configured to be brought into engagement with a lower surface of engagement member 54 of entrance pressing member 32, is provided at a central portion of operation lever 51. Operation lever 51 is rotated counterclockwise as seen in FIG. 5 by a biasing force of spring 55, and normally, with operating engagement section 51a held in a lowered position, entrance pressing member 32 is biased by a biasing force of spring 35-2 so as to be brought into abutment with tape conveyance path 38. As a result, normally, carrier tape 90 is prevented from being inserted from tape insertion section 21d by entrance pressing member 32.

To the contrary, when operation knob 51b, being provided at a rear end of operation lever 51, is lifted up by the operator, whereby operation lever 51 is rotated against the biasing force of spring 55, and entrance pressing member 32 is raised against the biasing force of spring 35 via operating engagement section 51a. By adopting this configuration, entrance pressing member 32 is spaced away from tape conveyance path 38, whereby carrier tape 90 can be inserted from tape insertion section 21d.

Figure 11:
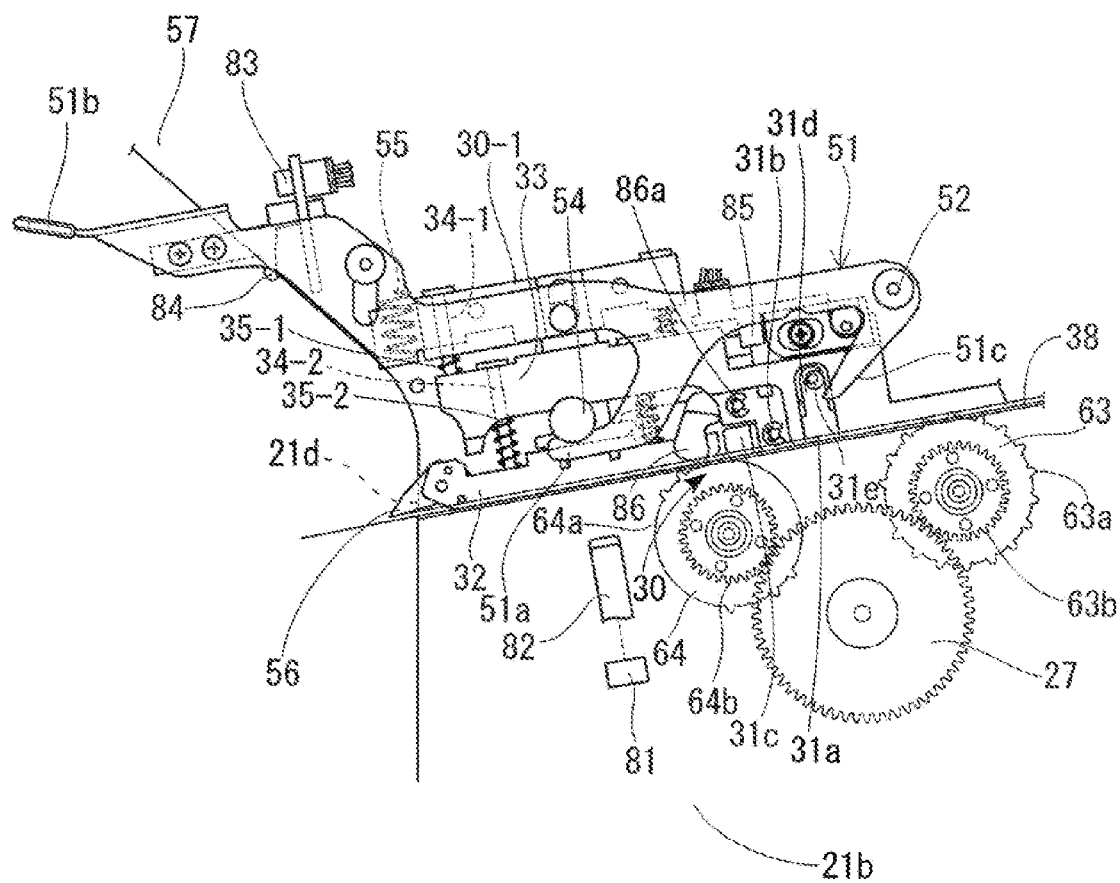
FIG. 11 is an operating state drawing of FIG. 5 showing a state where the carrier tape is conveyed after the operation lever of the feeder is returned to its original position.

Baffle plate 56, which is configured to close tape insertion section 21d, is pivotally supported at a rear portion of entrance pressing member 32. Baffle plate 56 prevents carrier tape 90 from being inserted between tape conveyance path 38 and entrance pressing member 32. When entrance pressing member 32 is raised, as shown in FIG. 11, baffle plate 56 is brought into engagement with the rear portion of the downstream side pressing member 33 to be rotated, whereby tape insertion section 21d is opened.

Stopper member 30 is provided on a downstream side of entrance pressing member 32 in such a way as to lie adjacent thereto. In stopper member 30, pivotal support portion 31b provided at a central portion is supported pivotally by downstream side pressing member 33, whereby stopper member 30 can be rotated. Abutment section 31a, which projects downwards, is formed on stopper member 30 at a lower portion lying further forwards than the pivotal support portion 31b. A rear end of stopper member 30 constitutes stop section 31c.

A spring, not shown, which is configured to bias abutment section 31a in a direction in which abutment section 31a is brought into abutment with tape conveyance path 38, is provided between downstream side pressing member 33 and stopper member 30. Protruding section 31d, which protrudes upwards, is formed at an upper portion of stopper member 30 which lies further forwards than pivotal support section 31b, and cam follower 31e is provided at a distal end of protruding portion 31d. Cam section 51c, which is formed at a front portion of operation lever 51, is allowed to engage with and disengage from cam follower 31e.

In such a state that operation lever 51 is rotated counterclockwise as seen in FIG. 5 by the biasing force of spring 55 and entrance pressing member 32 is held in the position where entrance pressing member 32 is in abutment with tape conveyance path 38, cam section 51c formed on operation lever 51 is spaced away from cam follower 31e of stopper member 30. As a result, stopper member 30 is rotated counterclockwise as seen in FIG. 5 about pivotal support section 31b by a biasing force of a spring, not shown, whereby abutting section 31a is brought into abutment with tape conveyance path 38, and stop section 31c is held in a position where stop section 31c is spaced away from tape conveyance path 38.

On the other hand, when operation lever 51 is rotated against the biasing force of spring 55, cam section 51c formed on operation lever 51 is brought into engagement with cam follower 31e of stopper member 30, whereby cam section 51c causes stopper member 30 to rotate counterclockwise as seen in FIG. 5 against the biasing force of the spring (not shown), so that stop section 31c is brought into abutment with tape conveyance path 38. As a result, with operation lever 51 caused to rotate against the biasing force of spring 55, when first carrier tape 90A is inserted from tape insertion section 21d, distal end of first carrier tape 90A is brought into abutment with stop section 31c of stopper member 30 to thereby be stopped in a predetermined position.

When first carrier tape 90A passes between abutment section 31a of stopper member 30 and tape conveyance path 38, abutting section 31a is lifted up by first carrier tape 90A, whereby stop section 31c of stopper member 30 is brought into abutment with tape conveyance path 38. Consequently, when the operator inserts second carrier tape 90B onto first carrier tape 90A from tape insertion section 21d in that state, a distal end of second carrier tape 90B is brought into abutment with stopper member 31c of stopper member 30, whereby second carrier tape 90B is stopped thereat. As a result, second carrier tape 90B is prevented from being conveyed downstream further, whereby second carrier tape 90B is caused to wait.

First sensor 81 is attached to feeder main body 21b, and first sensor 81 detects an insertion of first carrier tape 90A when first carrier tape 90A is inserted from tape insertion section 21d. First sensor 81 is such that first sensor 82 is switched on as a result of first dog 82, which projects from upper surface of tape conveyance path 38, is lowered by inserted first carrier tape 90A. First dog 82 is normally held in a position first dog 82 projects from the upper surface of tape conveyance path 38 by a biasing force of a spring, not shown, and when first carrier tape 90A is inserted, first dog 82 is depressed downward.

Second sensor 83 and third sensor 85 are attached to feeder main body 21b, and second sensor 83 detects a rotation of operation lever 51, while third sensor 85 is activated to operate when second carrier tape 90B is conveyed to tape conveyance path 38 on fourth sprocket 64. Second sensor 83 is switched on by second dog 84 attached to operation lever 51. Third sensor 85 is switched on by a rotation of third dog 86.

Third dog 86 can rotate as a result of pivotal support section 86a formed at a central portion of third dog 86 being pivotally supported on downstream side pressing member 33. Third dog 86 is normally biased counterclockwise as seen in FIG. 5 by a spring, not shown. As a result, when carrier tape 90 is not present on tape conveyance path 38, third dog 86 is brought into abutment with the upper face of tape conveyance path 38, while when first carrier tape 90A exists on tape conveyance path 38, a distal end of third dog 86 is brought into abutment with an upper surface of first carrier tape 90A.

As shown in FIG. 4, fourth sensor 65 is provided on feeder main body 21b in a position lying on a downstream side of third sprocket 63 (at a rear end portion of feeder 21), and fourth sensor 65 detects a presence of first carrier tape 90A and then outputs a detection signal resulting from the detection to control section 39. Fourth sensor 65 constitutes a sensor configured to detect a boundary portion between first carrier tape 90A and second carrier tape 90B. Fifth sensor 66 is provided on feeder main body 21b in a position lying on an upstream side of second sprocket 62 (at a front end portion of feeder 21) and fifth sensor 66 detects a presence of carrier tape 90 and then outputs a detection signal resulting from the detection to control section 39.

Levitation prevention member 28 is provided along an upper side of tape conveyance path 38 between third sprocket 63 and second sprocket 62. Pivotal support portion 28a is formed at a front end of levitation prevention member 28, and pivotal support portion 28a is pivotally supported on shaft portion 21c provided on feeder main body 21b, whereby levitation prevention member 28 is attached to feeder main body 21b so as oscillate. Upwardly bent guide portion 28b is formed at a rear end of levitation prevention member 28. Torsion spring 29 is attached to feeder main body 21b in a position lying above levitation prevention member 28 and biases levitation prevention member 28 downwards. A lower surface of levitation prevention member 28 is brought into tight contact with the upper face of tape conveyance path 38 by torsion spring 29.

Tape guide 77 is attached to an upper portion of feeder main body 21b which lies at front portion 38a of tape conveyance path 38 where first and second sprockets 61, 62 are positioned in such a manner as to cover tape conveyance path 38 from above. Tape conveyance path 38 is formed along a feeding direction of carrier tape 90 between tape guide 77 and feeder main body 21b. Tape guide 77 restricts carrier tape 90 engaging with sprocket 61 and the like from moving upwards and moving in the width direction and ensures the engagement of carrier tape 90 with sprockets 61, 62 and the like.

Figure 6:
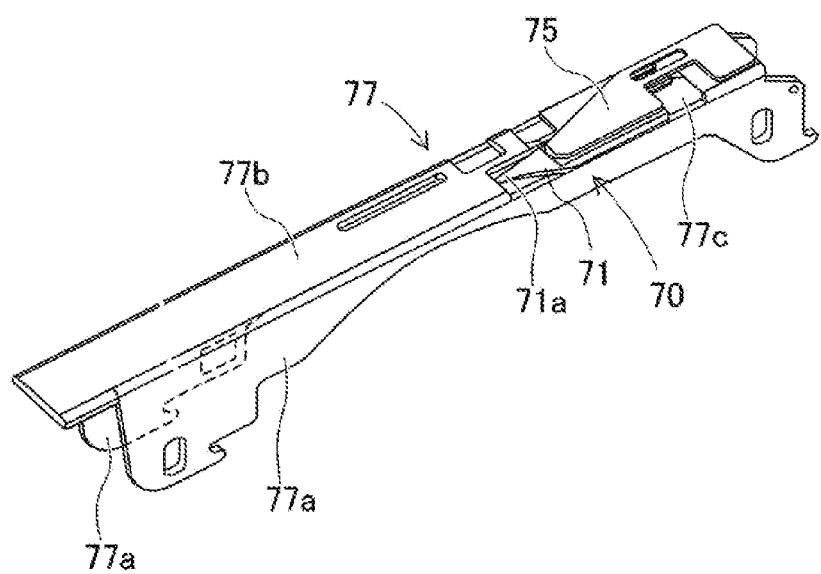
FIG. 6 is a perspective view showing a tape guide provided on a tape separating device.

As shown in FIG. 6, tape guide 77 is formed into a U-shape in section in such a manner as to be opened downwards, and both side walls 77a of tape guide 77 are pressed downwards of feeder main body 21b and held in place at front and rear thereby by a biasing force of a spring, not shown. Notch 77c is formed in upper wall 77b of tape guide 77 in a predetermined position including component pick-up position 21a, so that electronic component P is picked up from component storage section 91a of carrier tape 90 through notch 77c.

Figure 7:
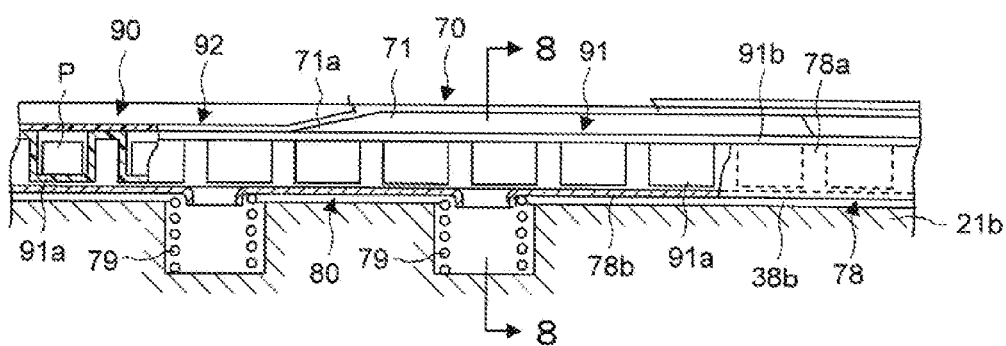
FIG. 7 is a drawing showing a pressing device provided on a tape conveyance path.

Tape separating device 70 is attached to upper wall 77b of tape guide 77 so as to separate cover tape 92 of carrier tape 90 fed to component pick-up position 21a. As shown in FIGS. 6 and 7, tape separating device 70 includes a plate-shaped separating member 71 having cutter 71a with a sharp distal end configured to separate one bonding section (a bonding section opposite to engagement holes 91c) of cover tape 92 of carrier tape 90. Then, cutter 71a of separating member 71 faces an interior of tape guide 77 from notch 77c before component pick-up position 21a and is configured to be brought into abutment with an upper surface of carrier tape 90. Cutter 71a of separating member 71 is inserted between an upper surface of base tape 91 and cover tape 92 as a result of carrier tape 90 being conveyed to thereby separate one side edge portion of cover tape 92. However, the other edge side (the side where engagement holes 91c are provided) of cover tape 92 is normally maintained bonded.

Plate-shaped folding-back member 75 is provided on separating member 71 of tape separating device 70. Folding-back member 75 raises one edge side of cover tape 92 separated by tape separating device 70 and folds it back to the other edge side. As a result, component storage section 91a of base tape 91 is opened.

As described above, tape separating device 70 folds back cover tape 92 while separating cover tape 92 as carrier tape 90 is moved to be fed and exposes electronic component P in component pick-up position 21a. A portion of carrier tape 90 that has passed through component pick-up position 21a is discharged to an outside portion of feeder 21 from tape discharge section 21e formed in the front portion of feeder main body 21b.

Figure 8:
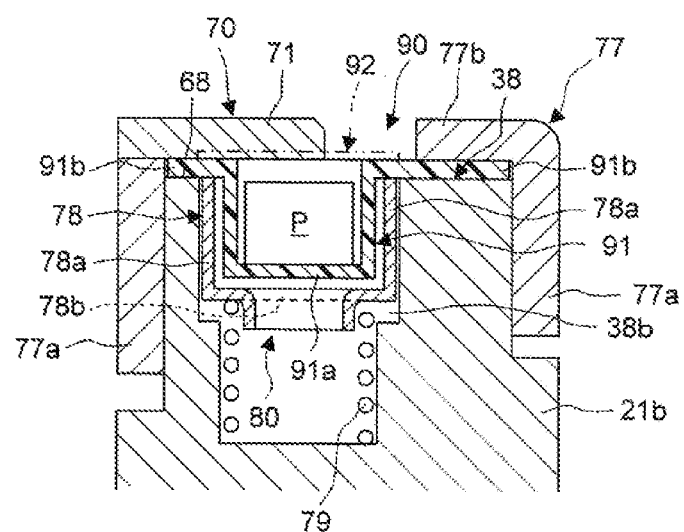
FIG. 8 is an enlarged sectional view of the pressing device taken along a line 8-8 in FIG. 7.

Guide section 68 (refer to FIG. 8) is formed between tape conveyance path 38 and both side walls 77a and upper wall 77b of tape guide 77 to guide flange sections 91b on both the sides of carrier tape 90 so as to convey carrier tape 90 along it. As shown in FIGS. 7 and 8, recessed groove 38b, configured to pass component storage section (embossed section) 91a of embossed carrier tape 90 through it, is formed on tape conveyance path 38. Pressing member 78, configured to press flange sections 91b on both the sides of carrier tape 90 upwards for flange sections 91b to be brought into abutment with upper wall 77b of tape guide 77, is disposed within recessed groove 38b. Pressing member 78 is pressed upwards towards upper wall 77b of tape guide 77 by biasing forces of multiple biasing members 79 made up of springs disposed at intervals in the conveying direction. Pressing device 80 is made up of pressing member 78 and biasing members 79 which are described above.

As shown in FIG. 8, pressing member 78 is formed of a U-shaped plate material including a pair of leg sections 78a positioned on both the sides of component storage sections 91a in the width direction and coupling section 78b configured to couple together leg sections 78a in recessed groove 38b on tape conveyance path 38. Pair of leg portions 78a has a height that enables leg sections 78a to be brought into abutment with lower surfaces of flange sections 91b of carrier tape 90 and to press flange sections 91b without pressing component storage sections 91a.

Figure 9:
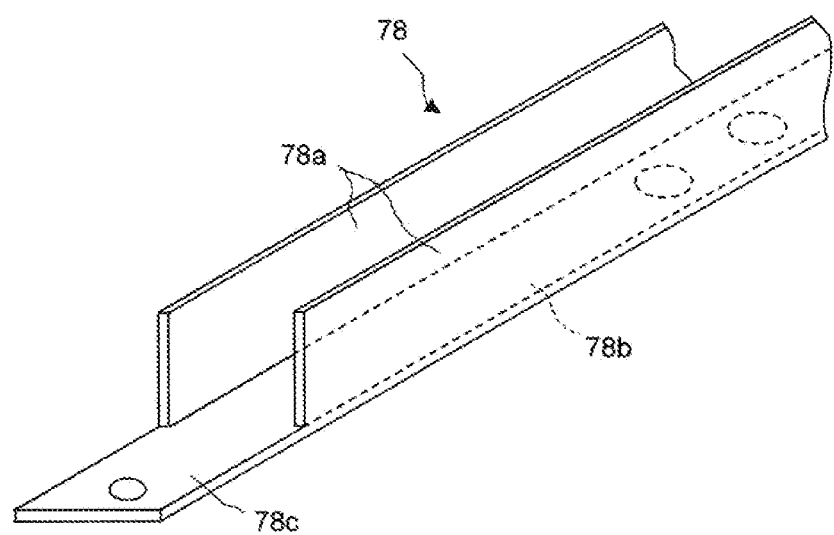
FIG. 9 is a perspective view showing a pressing member of the pressing device.

As shown in FIG. 9, flat plate section 78c is formed at one end of pressing member 78 which lies at a rear portion of the feeder, and flat plate section 78c is supported on feeder main body 21b by a fastener, not shown. In pressing member 78, pair of leg sections 78a are brought into abutment with flange sections 91b as a result of flat plate section 78c being deformed elastically by the biasing forces of biasing members 79. Pressing member 78 is made of copper so as to remove static electricity generated when cover tape 92 is separated.

(Operation of Feeder)

Next, referring to FIGS. 4, 5, 10, and 11, the operation of feeder 21 according to the embodiment described heretofore will be described. Here, first carrier tape 90 A is wound around front reel 810, and second carrier tape 90 B is wound around rear reel 820. Normally, operation lever 51 is held in the state shown in FIG. 5 by the biasing force of spring 55, entrance pressing member 32 is kept in abutment with tape conveyance path 38, and baffle plate 56 is rotated by its own weight to close tape insertion section 21d.

Figure 10:
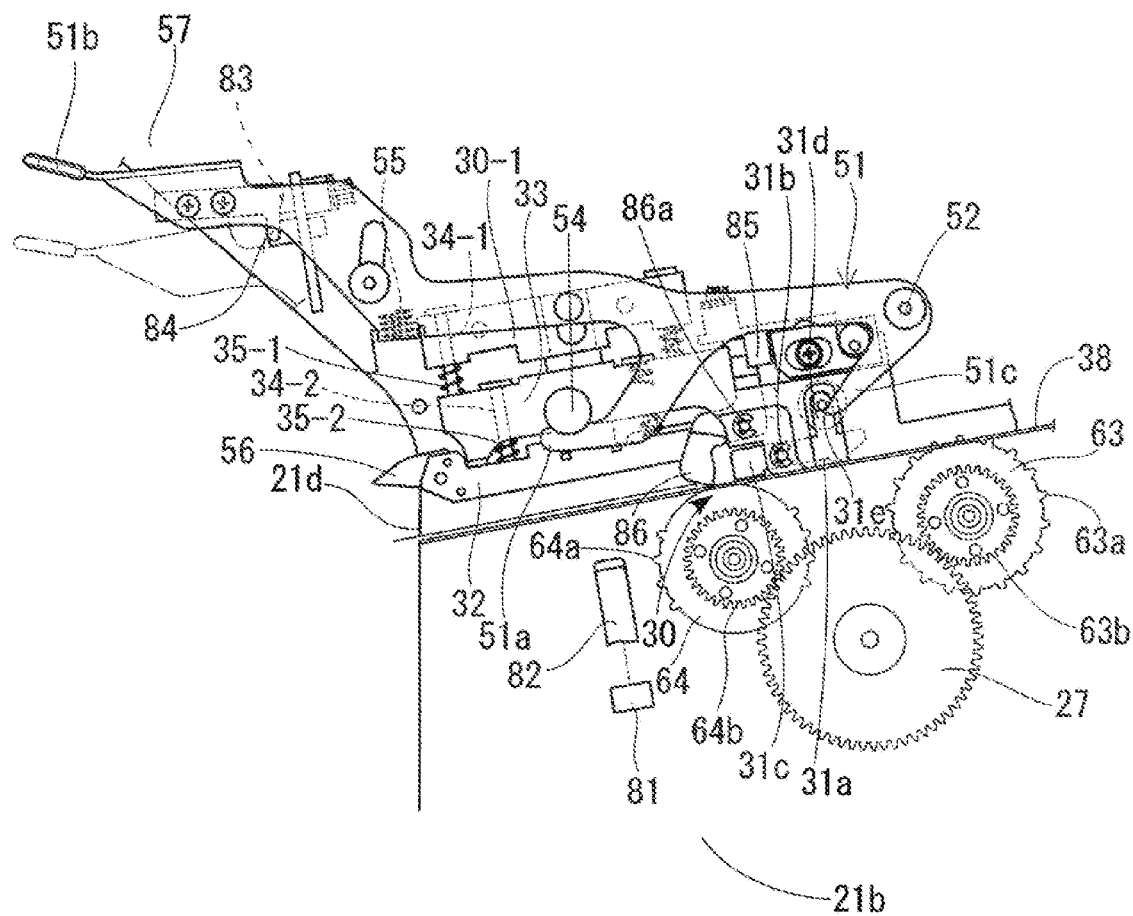
FIG. 10 is an operating state drawing of FIG. 5 showing a state in which a carrier tape is inserted by lifting up an operation lever of the feeder.

In this state, as shown in FIG. 10, the operator lifts up operation knob 51 b of operation lever 51. When operation lever 51 is lifted up, second sensor 83 is activated to operate by second dog 84, and the operation of operation lever 51 is detected. Entrance pressing member 32 is raised via operation engaging section 51a by operation lever 51.

This causes entrance pressing member 32 to move away from tape conveyance path 38, and baffle plate 56 is rotated by downstream side pressing member 33. As a result, tape insertion section 21 d is opened, enabling carrier tape 90 to be inserted. At the same time, operation lever 51 rotates, causing cam section 51c to rotate stopper member 30, whereby stop section 31c is brought into abutment with tape conveyance path 38.

In this state, the operator inserts a leading end of first carrier tape 90A from tape insertion section 21d onto tape conveyance path 38. Then, first carrier tape 90A is inserted to a predetermined position where the leading end of first carrier tape 90A comes into abutment with stop section 31c of stopper member 30. This causes first carrier tape 90A to activate first dog 82 and third dog 86 to operate, and therefore, first sensor 81 and third sensor 85 are activated to operate, whereby the sensors detect that first carrier tape 90A has been inserted into the predetermined position.

When first carrier tape 90A is inserted to the position where first carrier tape 90A comes into abutment with stop section 31c, the operation of operation lever 51 is released, whereby operation lever 51 is rotated to return to its original position indicated by a chain double-dashed line in FIG. 10 by the biasing force of spring 55. When operation lever 51 rotates to return to its original position, entrance pressing member 32 is lowered toward tape conveyance path 38 to press inserted first carrier tape 90A toward tape conveyance path 38.

When the insertion of first carrier tape 90A is detected and the rotation and return of operation lever 51 to its original position is detected (second sensor 83 is turned off), second servomotor 23 is driven, and third and fourth sprockets 63, 64 are rotated. As a result, engagement projections 64a of fourth sprocket 64 are brought into engagement with engagement holes 91c of first carrier tape 90A, whereby first carrier tape 90A is conveyed to third sprocket 63 by fourth sprocket 64.

When first carrier tape 90A is conveyed by fourth sprocket 64, downstream side pressing member 33 is lifted up against the biasing force of spring 35-1 by first carrier tape 90A, whereby first carrier tape 90A is conveyed between downstream side pressing member 33 and tape conveyance path 38.

As this occurs, since engagement projections 64a of fourth sprocket 64 are formed on only part of the outer circumference of fourth sprocket 64, when engagement projections 64c are brought into engagement with engagement holes 91c of first carrier tape 90A, first carrier tape 90A is moved to third sprocket 63 intermittently. As a result, first carrier tape 90A is never rapidly pulled in towards third sprocket 63. When downstream side pressing member 33 is lifted up by first carrier tape 90A, stopper member 30 and pivotal support sections 31b, 86a of third dog 86 are integrally raised.

When engagement holes 91c provided in first carrier tape 90A conveyed by fourth sprocket 64 are brought into engagement with engagement projections 63 a of third sprocket 63, first carrier tape 90 A is conveyed to second sprocket 62 by third sprocket 63. Since engagement projections 63a are formed along the full circumference of the outer circumference of third sprocket 63, first carrier tape 90A is conveyed to second sprocket 62 within a short period of time.

Further, the leading end of first carrier tape 90A enters below the levitation prevention member 28 from between guide section 28b and tape conveyance path 38. The leading end of first carrier tape 90A is prevented from levitating from tape conveyance path 38 by levitation prevention member 28, and is conveyed towards second sprocket 62. When fifth sensor 66 detects the leading end of first carrier tape 90A conveyed by third sprocket 63, first servomotor 22 and second servomotor 23 intermittently rotate sprockets 61 to 64 at pitch intervals of electronic components P.

When engagement holes 91c provided in first carrier tape 90A are brought into engagement with engagement projections 62a of second sprocket 62, first carrier tape 90A is fed to tape separating device 70 by second sprocket 62, and cover tape 92 is separated from first carrier tape 90A by tape separating device 70.

As this occurs, since first carrier tape 90A is pressed towards upper wall 77b of tape guide 77 by pressing member 78 biased by biasing members 79 to be brought into abutment with cutter 71a of separating member 71, cutter 71a of separating member 71 is inserted between the upper surface of base tape 91 and cover tape 92 in an ensured manner, whereby cover tape 92 is separated from first carrier tape 90A accurately.

Then, when engagement holes 91c provided in first carrier tape 90A are brought into engagement with engagement projections 61a of first sprocket 61, electronic components P stored in component storage sections 91a of first carrier tape 90A are sequentially positioned in component pick-up position 21a by first sprocket 61. As this occurs, cover tape 92, which is separated from base tape 91 on one side thereof, is bent back to an opposite side to component storage sections 91a by folding-back member 75. This uncovers component storage sections 91a which are now not covered with cover tape 92 which is now separated from base tape 91 on one side thereof, and therefore, electronic components P are picked up easily and in an ensured manner.

When first carrier tape 90A is being conveyed by feeder 21, as shown in FIG. 11, first carrier tape 90A presses abutment section 31a of stopper member 30, whereby stopper member 30 is rotated against the biasing force of spring 36. This brings stop section 31c of stopper member 30 into contact with the upper surface of first carrier tape 90A.

In this state, as described above, operation lever 51 is rotated (second sensor 83 is turned on), and the leading end of second carrier tape 90B is passed through tape insertion section 21d to be inserted between first carrier tape 90A and entrance pressing member 32. Then, the leading end of second carrier tape 90B comes into contact with stop section 31c of stopper member 30, whereby second carrier tape 90B is stopped at the position.

As a result, second carrier tape 90B is prevented from being conveyed downstream further, whereby second carrier tape 90B is caused to wait. When second carrier tape 90B is inserted to a position where second carrier tape 90B is brought into abutment with stop section 31 c of stopper member 30, third dog 86 is activated to operate by second carrier tape 90B, whereby the insertion of second carrier tape 90B is detected by third sensor 85.

When the operate of operation lever 51 is released after second carrier tape 90B is inserted, although operation lever 51 returns to its original position, since first carrier tape 90A presses abutment section 31a of stopper member 30, second carrier tape 90B is kept stopped by stop section 31c of stopper member 30. Even in the event that second carrier tape 90B is attempted to be inserted into tape insertion section 21d without rotating operation lever 51, second carrier tape 90B is prevented from being inserted into tape insertion section 21d by baffle plate 56 which is in abutment with the upper surface of first carrier tape 90A (refer to FIG. 11).

When a rear end of first carrier tape 90A is conveyed further downstream than a front end of second carrier tape 90B, engagement holes 91 c provided in second carrier tape 90B are brought into engagement with engagement projections 64a of fourth sprocket 64. Thereafter, second carrier tape 90B enters a gap formed by first carrier tape 90A between tape conveying path 38 and stopper member 30 and is conveyed towards second sprocket 62. When the leading end of second carrier tape 90B pushes up abutment section 31a, as described above, stopper member 30 is rotated again against the biasing force of spring 36, whereby a further carrier tape 90 is prevented from entering by stopper member 30.

Figure 12:
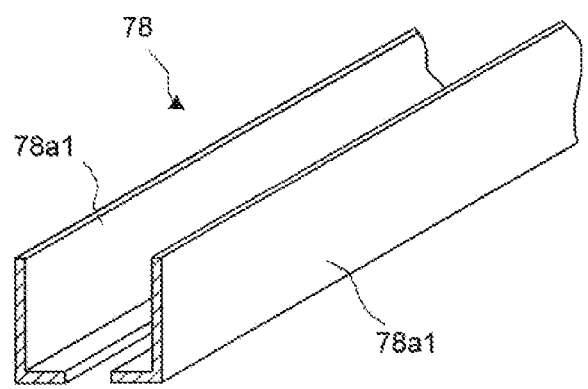
FIG. 12 is a perspective view corresponding to FIG. 9 showing a modified example of the pressing member.

FIG. 12 shows a modified example of pressing member 78 configured to press embossed carrier tape 90, and this modified example differs from the previously described embodiment, such that while in the previous embodiment, pair of leg sections 78a is coupled together by coupling section 78b, whereby pressing member 78 is integrally formed as a single member, in the modified example, as shown in FIG. 12, pressing member 78 is configured of two L-shaped leg sections 78a1, 78a2, which are separate members. Biasing members 79 (refer to FIG. 8) configured to press pressing member 78 may be provided so as to straddle two leg sections 78a1, 78a2, or, two leg sections 78a1, 78a2 may be pressed against by different biasing members.

According to the embodiment that has been described heretofore, feeder 21 includes feeder main body 21 b, feeding device 60 provided in feeder body 21b and configured to feed embossed carrier tape 90 to component pick-up position 21a, tape guide 77 provided in feeder main body 21b and including tape separating device 70 configured to separate cover tape 92 covering component storage sections 91a, tape conveyance path 38 formed along the feeding direction of embossed carrier tape 90 between feeder main body 21b and tape guide 77 and having recessed groove 38b through which component storage sections 91a of embossed carrier tape 90 can be inserted and passed, and pressing device 80 arranged in recessed groove 38b of tape conveyance path 38 and configured to bring embossed carrier tape 90 into abutment with tape guide 77, and pressing device 80 is positioned at both the sides of component storage sections 91a in the width direction within recessed groove 38b and configured to press flange sections 91b without pressing component storage sections 91a.

This enables pressing device 80 to bring embossed carrier tape 90 into abutment with tape separating device 70 accurately without press collapsing component storage sections 91a of embossed carrier tape 90, thereby making it possible to separate cover tape 92 in an ensured manner.

In addition, according to the embodiment that has been described above, pressing device 80 includes pressing member 78 configured to press flange sections 91c and biasing members 79 configured to bias pressing member 78 in the direction in which pressing member 78 is brought into abutment with tape guide 77. This enables pressing member 78 biased by biasing members 79 to press embossed carrier tape 90 against separating member 71 of tape separating device 70 without press collapsing component storage sections 91a.

According to the above embodiment, pressing member 78 includes the U-shaped plate material including pair of leg sections 78 which are located at both the sides of component storage sections 91a in the width direction in recessed groove 38b and coupling section 78b configured to couple pair of leg sections 78a together. This enables pair of leg sections 78a of pressing member 78 to press flange sections 91b at both the sides of embossed carrier tape 90, whereby embossed carrier tape 90 can be pressed against separating member 71 of tape separating device 70 without press collapsing component storage sections 91a.

Further, according to the embodiment that has been described above, feeding device 60 has two sprockets 61 (62), 63 (64) configured to be brought into engagement with sprocket holes (engagement holes) 91c provided in carrier tape 90, and one sprocket 61 (62) is disposed in the vicinity of component pick-up position 21a, while the other sprocket 63 (64) is disposed in the vicinity of tape insertion section 21d into which the carrier tape 90 is inserted, whereby two front and rear carrier tapes 90 (first and second carrier tapes 90A, 90B) can be fed continuously to component pick-up position 21a without connecting them together.

This enables the feeder of this embodiment to be applied to an automatic loading type feeder in which when first carrier tape 90A is used up completely, second carrier tape 90B is automatically conveyed so that second carrier tape 90B is started to be used.

In the embodiment described above, although feeder 21 is described in which embossed carrier tape 90 is conveyed along tap conveyance path 38, a non-embossed carrier tape (a paper tape or a punched tape) can also be conveyed in a similar manner, and non-embossed carrier tape is conveyed whereby a cover tape is separated by tape separating device 70 in the same manner as that described above.

Further, in the embodiment described above, the example has been described in which first carrier tape 90A and second carrier tape 90B are continuously fed to component pick-up position 21a without being connected together by feeder 21 including sprocket 61 (62) configured to be brought into engagement with first carrier tape 90A to thereby feed electronic components P stored on first carrier tape 90A to component pick-up position 21 a, and sprocket 63 (64) configured to be brought into engagement with waiting second carrier tape 90B to feed second carrier tape 90B to the position where second carrier tape 90B is brought into engagement with sprocket 61. However, the present disclosure is not limited to the configuration of feeder 21 described heretofore, and hence, feeder 21 can adopt any configuration as long as feeder 21 can feed first carrier tape 90A and second carrier tape 90B to component pick-up position 21a continuously without providing sprockets and without connecting them together.

As described above, the present disclosure is not limited to the configuration described in the embodiment described above, and hence, the present disclosure can adopt various forms without departing from the spirit and scope of the present disclosure.

INDUSTRIAL APPLICABILITY

The feeder according to the present disclosure is suitable for use for a feeder including a tape separating device configured to separate a cover tape bonded to a base tape of a carrier tape.

DESCRIPTION OF REFERENCE SIGNS

21 . . . Feeder, 21a . . . Component pick-up position, 21b . . . Feeder main body, 38 . . . Tape conveyance path, 38b . . . Recessed groove, 60 . . . Feeding device, 70 . . . Tape separating device, 71 . . . Separating member, 77 . . . Tape guide, 78 . . . Pressing member, 78 a . . . Leg sections, 78b . . . Coupling section, 79 . . . Biasing member, 80 . . . Pressing device, 90 (90 A, 90 B) . . . Carrier tape, 91 . . . Base tape, 91a . . . Component storage section, 92 . . . Cover tape.

The invention claimed is:
1. A feeder, for conveying an embossed carrier tape, having a component storage section with protruding shape and flange sections extending outwards from both sides of the component storage section, comprising:
  a feeder main body;
  a feeding device provided on the feeder main body and configured to feed the embossed carrier tape to a component pick-up position;
  a tape guide provided on the feeder main body and having a tape separating device configured to separate a cover tape covering the component storage section;
  a tape conveyance path, being provided between the feeder main body and the tape guide with extending along a tape feeding direction of the embossed carrier tape, and having a recessed groove through which the component storage section of the embossed carrier tape can be inserted and passed; and
  a pressing device disposed in the recessed groove of the tape conveyance path and configured to press the embossed carrier tape in a direction in which the embossed carrier tape is brought into abutment with the tape guide, wherein the pressing device is positioned on both sides of the component storage section in a width direction in the recessed groove and configured to press the flange sections without pressing the component storage section.

2. The feeder according to claim 1, wherein the pressing device comprises a pressing member configured to press the flange sections; and a biasing member configured to bias the pressing member in a direction in which the pressing member is brought into abutment with the tape guide.

3. The feeder according to claim 2, wherein the pressing member comprises a U-shaped plate material comprising a pair of leg sections positioned at both sides of the component storage section in a width direction in the recessed groove, and a connecting section configured to connect the pair of leg sections together.

4. The feeder of claim 1, wherein the feeding device comprises two sprockets configured to be brought into engagement with sprocket holes provided in the carrier tape, one sprocket being provided near the component pick-up position, the other sprocket being provided near a tape inserting section into which the carrier tape is inserted, and capable of feeding continuously two front and rear carrier tapes like the carrier tape to the component pick-up position without having to connect the two carrier tapes together.

* * * * *